United States Patent [19]

Kyomasu et al.

[11] 4,366,556

[45] Dec. 28, 1982

[54] SEMICONDUCTOR MEMORY DEVICE

[75] Inventors: Mikio Kyomasu; Yoshiharu Nakao; Mitsuo Nakayama, all of Itami, Japan

[73] Assignee: Mitsubishi Denki Kabushiki Kaisha, Tokyo, Japan

[21] Appl. No.: 136,461

[22] Filed: Mar. 31, 1980

Related U.S. Application Data

[63] Continuation-in-part of Ser. No. 926,745, Jul. 21, 1978, abandoned.

[30] Foreign Application Priority Data

Jul. 22, 1977 [JP] Japan ................................. 52-88631

[51] Int. Cl.³ .................... G11C 7/00; G11C 11/40
[52] U.S. Cl. ................................. 365/189; 365/185; 365/181
[58] Field of Search ............... 365/104, 181, 184, 189, 365/185

[56] References Cited

U.S. PATENT DOCUMENTS

| | | | |
|---|---|---|---|
| 3,836,894 | 9/1974 | Cricchi | 365/184 |
| 4,114,055 | 9/1978 | Hollingsworth | 365/184 |
| 4,122,547 | 10/1978 | Schroeder et al. | 365/181 |

OTHER PUBLICATIONS

Schroeder et al., "A 1024-Bit, Fused-Link CMOS PROM", 1977 IEEE Internat. Solid-State Circuits Conf., ISSCC Dig. of Tech. Papers, pp. 190-191.
Fukunaga et al., "FA-CMOS Process for Low Power PROM with Low Avalanche-Injection Voltage", IEDM Digest of Tech. Papers (1977), pp. 291-293.

Primary Examiner—Stuart N. Hecker
Attorney, Agent, or Firm—Wenderoth, Lind & Ponack

[57] ABSTRACT

A memory cell formed of two serially connected MOS transistors one of which has a floating gate is connected to a series combination of a Y address MOS transistor, a readout selection MOS transistor and an MOS transistor disposed in an output buffer circuit across two DC sources. A writing selection MOS transistor is connected across the series combination of the last-mentioned two transistors. The Y address MOS transistor, the readout selection MOS transistor, the output buffer MOS transistor and the writing selection MOS transistor are all operated in the triode region with $V_G - V_{TH} > V_D$ and at least one of these MOS transistors has a channel conductivity type different from the channel conductivity type of the memory cell MOS transistors.

6 Claims, 15 Drawing Figures

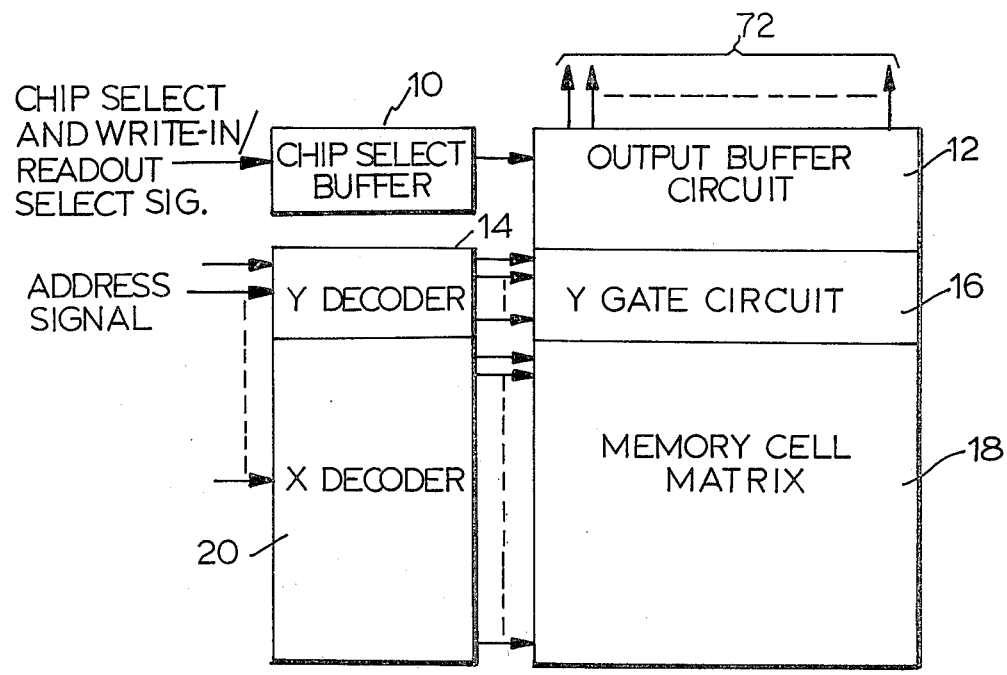
FIG.1
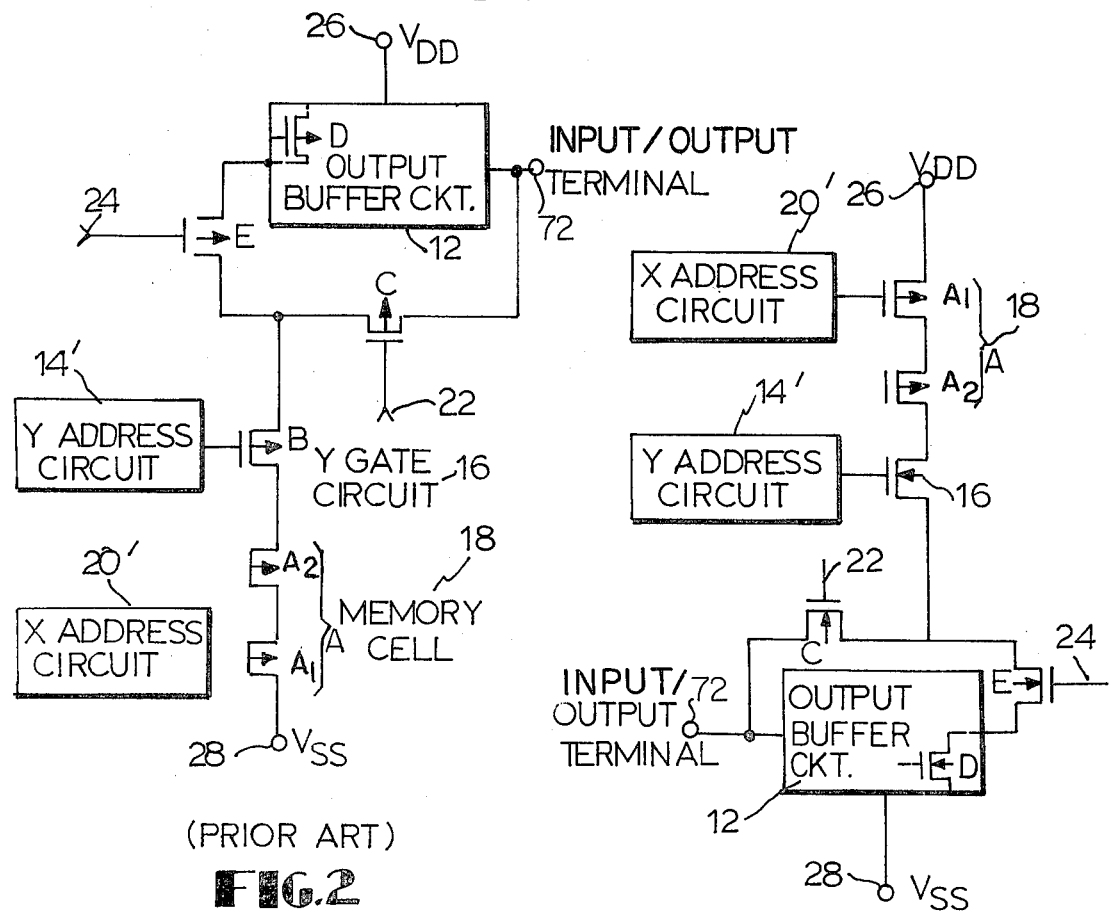
(PRIOR ART)
FIG.2
FIG.3

READ MODE

WRITE MODE

SEMICONDUCTOR MEMORY DEVICE

This is a continuation-in-part application of application Ser. No. 926,745 filed July 21, 1978, now abandoned.

BACKGROUND OF THE INVENTION

The invention relates to a semiconductor memory device and more particularly to a MOS semiconductor rewritable memory device for performing a storage operation by accumulating an electric charge on the electrically insulating film thereof.

The so-called MOS semiconductor non-volatile memory devices are generally classified into the FAMOS type in which the memory cells have a floating gate and the MNOS type in which the gate insulating films have a double layer structure. In both types each memory cell and the associated circuits thereof have previously been of either the p type or the n type. However, the FAMOS type semiconductor memory device is disadvantageous because the writing in these non-volatile memories is accomplished by applying a high electric field across the pn junction to cause an avalanche breakdown therein to produce hot carriers and these, in turn, traverse the associated electrical insulation barrier by means of an electric field established across the particular gate and the semiconductor substrate with the associated stray capacitance and accumulate on the floating gate.

The formation of a non-volatile memory requires a selection circuit for selecting one memory cell from a matrix as required and a Y gate circuit and an output buffer circuit connected to each of the memory cells. Therefore, in the writing operation, the electric field is applied across a selected one of the memory cells through those two circuits connected thereto. In conventional single-channel FAMOS memory devices, application of a high electric field across the particular memory cell to cause the abovementioned avalanche breakdown is required. Also the Y gate circuit and output buffer circuit MOS transistors have previously been operated in the saturation region. Thus a voltage drop is developed due to the ratio of conductance between the Y gate circuit and the memory cell connected thereto. This results in a disadvantage because in the writing operation a voltage higher than the avalanche voltage for the associated memory cell must be applied to the output buffer circuit.

In addition, a high electric field should be applied across the series connected Y gate circuit, the MOS transistor which selects the readout mode of the output buffer circuit and that buffer circuit. This is one of the great causes of the breakage of the gate oxide film of MOS transistors, the punch-through of the pn junctions therein, the deterioration of components involved etc. which may occur in the writing operation.

Accordingly, it is an object of the present invention to provide a new and improved semiconductor memory device for preforming the writing operation by accumulating an electric charge on the electrically insulating film thereof and in which the power consumption required for the writing operation is decreased.

It is another object of the present invention to provide a new and improved semiconductor memory device for performing the writing and readout operations at high speed.

It is still another object of the present invention to provide a new and improved semiconductor memory device for performing the writing operation with a low voltage.

SUMMARY OF THE INVENTION

The present invention provides a semiconductor memory device for performing a storing operation by accumulating an electric charge on an electrically insulating film, comprising a memory cell including a memory element formed of a MOS transistor, a gate circuit including a MOS transistor connected to the memory cell, a readout selection circuit including a MOS transistor serially connected to the MOS transistor included in the gate circuit, an output buffer circuit including a MOS transistor connected to the MOS transistor included in the readout selection circuit, and a writing selection circuit including a MOS transistor connected in a parallel circuit relationship with the MOS transistors included in the readout selection circuit and the output buffer circuit and wherein the MOS transistor forming the memory cell is a different conductivity type from at least one of the MOS transistors included in the gate, the writing and readout selection and the output buffer circuits.

The semiconductor memory device preferably comprises memory cells disposed in a matrix storing electric charges and a signal path from each of the memory cells within the memory matrix leading to the output terminal of an output buffer circuit. The signal path includes a first MOS transistor forming each of the memory cells, a second MOS transistor disposed in a Y gate circuit and selectively operated by a Y decoder, a third MOS transistor for selecting the readout mode in the output buffer circuit, and a fourth MOS transistor disposed in the output buffer circuit, all the MOS transistors being serially interconnected, and a multistage inverter circuit connecting the junction of the third and fourth transistors to the output terminal of the output buffer. The inverter circuit provides an output which can be put into three states with chip selection signals. The output terminal is connected via an amplifier circuit included in the output buffer circuit to a fifth MOS transistor connected to the output buffer circuit to select the writing mode, the fifth transistor having the other terminal connected to the third and fourth transistors. The first, second, third and fifth transistors are MOS transistors having the same type conductivity, the fourth transistor is composed of an MOS transistor of the opposite conductivity type to the first, second, third and fifth transistors.

The writing selection circuit and the readout selection circuit may be formed of complementary MOS transistors.

BRIEF DESCRIPTION OF THE DRAWINGS

The present invention will become more readily apparent from the following detailed description taken in conjunction with the accompanying drawings in which:

FIG. 1 is a partial block diagram of a generic form of an eraseable programmable read only memory circuit;

FIG. 2 is a combined block and circuit diagram of one portion of a conventional 1 channel FAMOS memory device;

FIG. 3 is a combined block and circuit diagram of the essential portion of one embodiment of the semiconductor memory device according to the present invention;

Throughout the Figures like reference numerals and characters designate identical or corresponding components.

DESCRIPTION OF THE PREFERRED EMBODIMENTS

Figures 4, 10:
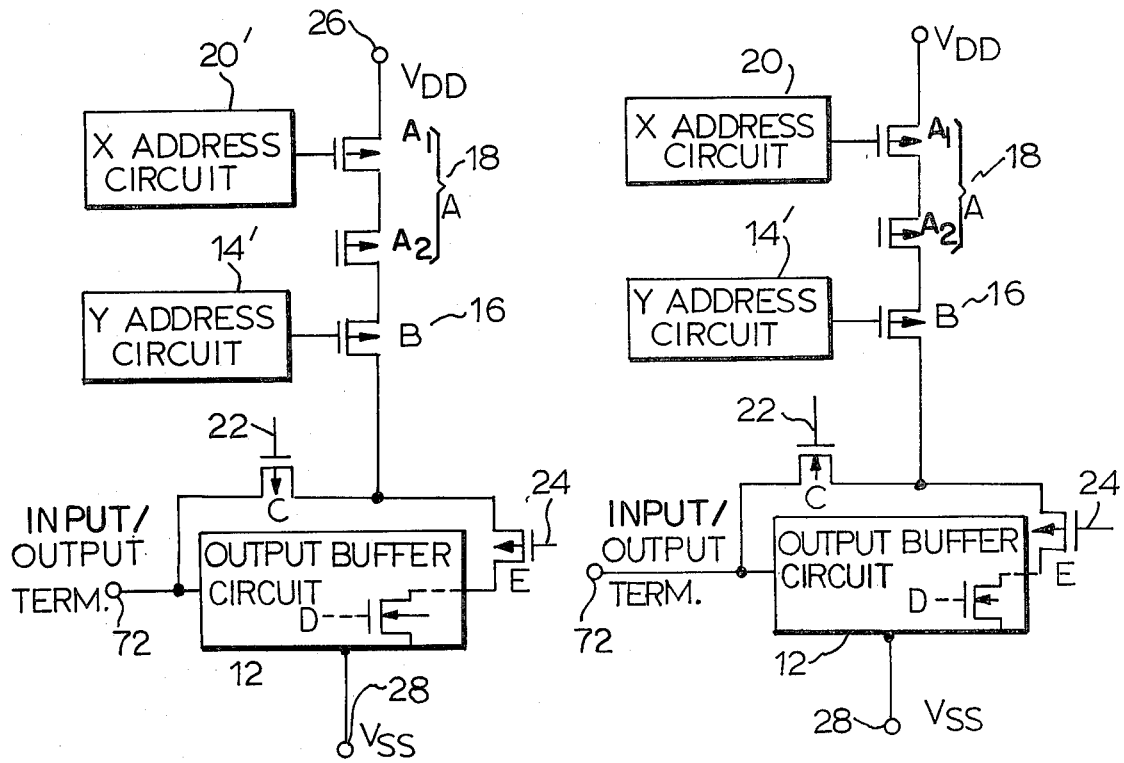
FIG. 4 is a diagram similar to FIG. 3 illustrating a modification of the present invention.
FIG. 10 is a diagram similar to FIG. 3 illustrating another modification of the present invention.

The determination of which of a high or low level state is stored in a memory cell has previously been made according to whether or not a high voltage is applied across both ends of a floating gate MOS transistor included in the memory cell so as to inject electrons into a floating gate thereof. However, the present invention applies a voltage across both ends of the transistor which does not permit electrons to be injected into the floating gate of such a transistor, thereby to store a low level in an associated memory cell.

Referring now to FIG. 1 of the drawings, there is illustrated a generic form of an eraseable programable read only memory device (which is abbreviated herein after as "EPROM") with which the present invention is concerned. In the arrangement illustrated a chip selection buffer 10 is connected to an output buffer circuit 12 and receives chip selection and write-in/readout selection signals and operates to change the input/output terminals 72 of the output buffer circuit 12 to input terminals or output terminals for the EPROM. When the input/output terminals 72 are changed to input terminals, a Y address signal is applied to a decoder 14 while a writing signal is applied via the terminals 72, now functioning as input terminals through output buffer 12 to a Y gate circuit 16 and passed through that portion thereof selected by the output from the Y decoder 14 until it reaches a selected column of memory cells of a memory matrix 18 which includes a multiplicity of memory cells arranged in rows and columns. In the memory matrix 18 an avalanche breakdown is caused and the writing signal is stored in that memory cell of the selected column of memory cells of the matrix 18 appearing in the row of memory cells selected by an X decoder 20 operated in response to an address signal applied thereto. This storage of the signal is accomplished by accumulating an electric charge on an electrically insulating film operatively coupled to the selected memory cell.

On the other hand, the readout operation is performed by selecting a desired one of the memory cells in the matrix 18 by the X decoder 20 and the Y decoder 15 and delivering the signal stored in the desired memory cell to the output buffer circuit 12 which is operated as an output circuit by means of the chip selection buffer 10. Then the readout signal is developed at the terminals 72 of the buffer circuit 12, now functioning as output terminals.

The arrangement of FIG. 1 operated as described above may have a fundamental circuit configuration as shown in FIG. 2. The arrangement illustrated comprises a pair of serially connected MOS transistors $A_1$ and $A_2$ forming a representative memory cell designated by the reference numeral 18' and arranged in the matrix 18, an MOS transistor B disposed in the Y gate circuit 16, an MOS transistor E disposed in a readout selection circuit 24 (which forms a part of chip selection buffer 10) for the output buffer circuit 12 and an MOS transistor D disposed in the output buffer circuit 12. All of the transistors $A_1, A_2$, B, E and D are serially interconnected in the named order to form a signal path from the selected memory cell leading to the output terminal of the output buffer circuit 12. A MOS transistor C disposed in a writing selection circuit 22 (which forms a part of chip selection buffer 10) for the output buffer circuit 12 is connected across the series combination of the transistors E and D. The transistor D has one terminal connected to a DC source 26 and another terminal connected to the input/output terminal 72 of the output buffer circuit 12 together with one terminal of the transistor C. The lower transistor $A_1$ as viewed in FIG. 2 is connected to another DC source 28. All the MOS transistors are of the p channel type.

It will readily be understood that one set of the transistors B, C, D and E is provided for each memory cell. In order to select that memory cell in which data is to be stored or from which the stored data is to be read out, all the lower transistors $A_1$ as viewed in FIG. 2 have their gate terminals connected to an X address circuit 20' and all the transistors B have their gate terminals connected to a Y address circuit 14'. Also the transistors C, D and E have their gate terminals connected to respective peripheral circuits (not shown) for selective operation.

In the arrangement of FIG. 2, the transistors B through D are operated in a region fulfilling the relationship $V_G - V_{TH} < V_D$ where $V_G$, $V_{TH}$ and $V_D$ designate the gate, the threshold and the drain voltage of each MOS transistor, respectively.

Therefore each of the MOS transistors has its source voltage lower than its threshold voltage than its drain voltage.

The arrangement shown in FIG. 2 has disadvantages as above described.

Complementary MOS transistor circuits are well known as circuits in which the MOS transistors operate in the triode region. In such circuits the "H" output is charged and discharged through the p channel MOS transistor while the "L" output is charged and discharged through the n channel MOS transistors. Therefore use of the saturation region is not required as in single channel transistors. The present invention is based on this principle.

According to the principles of the present invention, an EPROM device includes a signal path from each memory cell in the memory matrix leading to an input/output terminal of the output buffer circuit and formed by a circuit with MOS transistors having different conductivity types. The voltage drops thereby developed across the peripheral circuits connected to the gate electrodes of those MOS transistors can be made as low as possible and further the electric source system for the peripheral circuits is employed only during the writing operation thereby decreasing the voltages applied across the peripheral circuits. In other words, in order to reduce the high electric power required for writing in the memory cells of a FAMOS transistor integrated circuit, the writing is effected from a writing selection circuit through a gate circuit without a writing voltage being applied to both the readout selection circuit and the output buffer circuit. This measure results in only the memory cells consuming electric power.

Further the MOS transistors forming the memory cell have a different conductivity type from at least one of the MOS transistors included in the associated signal path.

Referring now to FIG. 3 there is illustrated one embodiment of the semiconductor memory device according to the present invention. The arrangement illustrated comprises a pair of first p channel MOS transistors $A_1$ and $A_2$ serially interconnected to form a memory cell 18′ disposed in the memory matrix 18 (not shown in FIG. 3), a second n channel MOS transistor B included in the Y gate circuit 16, a third n channel MOS transistor C included in the writing selection circuit 22 and a fourth n channel MOS transistor D disposed in the output buffer circuit 12. All the MOS transistors A, A, B, C and D are serially interconnected in the named order and a fifth n channel MOS transistor E included in the readout selection circuit 24 is connected across the series connected transistors C and D with the source electrode of each transistor connected to the drain electrode of the adjacent transistor. The upper transistor $A_1$ as viewed in FIG. 3 has its drain electrode connected to the DC source 26 having a potential $V_{DD}$ and the transistors E and D have their source electrodes connected to the DC source 28 having a potential $V_{SS}$. The source electrode of transistor C and the drain electrode of transistor D are connected to the input/output terminal 72 of the output buffer circuit 12. That terminal serves as an input terminal during the writing operation and an output terminal during a reading operation.

The X address circuit 20′ is connected to the gate electrode of the upper MOS transistor $A_1$ and to the gate electrode of like transistors in the row and the Y address circuit 14′ is connected to the gate electrode of the MOS transistor B and like transistors in the row to select that memory cell into which data is to be stored and from which the stored data is to be readout. The lower transistors $A_2$ in each memory cell 18′ have their gate electrodes floating and therefore have floating gate regions. The remaining MOS transistors have their gate electrodes connected to respective peripheral circuits (not shown) for selective operation.

A writing signal is applied to the input/output terminal 72 of the output buffer circuit 12, now acting as the input terminal, and then passed through the writing selection transistor C, and the Y gating transistor B until it is written in the memory cell 18′ formed of the two transistors $A_1$ and $A_2$. On the other hand data stored in the memory cell 18′ is read out through the Y gating transistor B, the readout selection transistor E and the output buffer transistor D and is developed at the input/output terminal 72 of the output buffer circuit 12.

In the arrangement of FIG. 3, the memory cell is formed by the p channel MOS transistors $A_1$ and $A_2$ and the signal path therefor includes n channel MOS transistors. The transistors B, C, D and E are operated in the triode region. That is, a voltage is applied to the source electrode of each transistor. Therefore, the relationship $V_G - V_{TH} > V_D$ is always fulfilled. The operation as above described is based upon the same principles as the operation of the usual complementary MOS (CMOS) inverters. Therefore the voltage drop across each transistor alone can improve the ratio of mutual conductance.

If this ratio of mutual conductance causes a voltage drop across the transistor D then the transistor C may fulfill the relationship $V_G - V_{TH} > V_D$ even though it is not of the n channel type. Under these circumstances, the arrangement of FIG. 3 may be modified substantially as shown in FIG. 4 wherein the transistors B, C and E have their channels changed from the n to the p type conductivity and the channel conductivity type of the remaining transistors remains unchanged. The arrangement of FIG. 4 is unfavorable in that the voltage drop is suppressed but favorable in that the readout speed is increased by utilizing the entire potential difference $V_{DD} - V_{SS}$ between the sources 26 and 28. This is because the series combination of the transistors A, B, E and D shown in FIG. 4 forms a perfect complementary MOS inverter.

Figure 5:
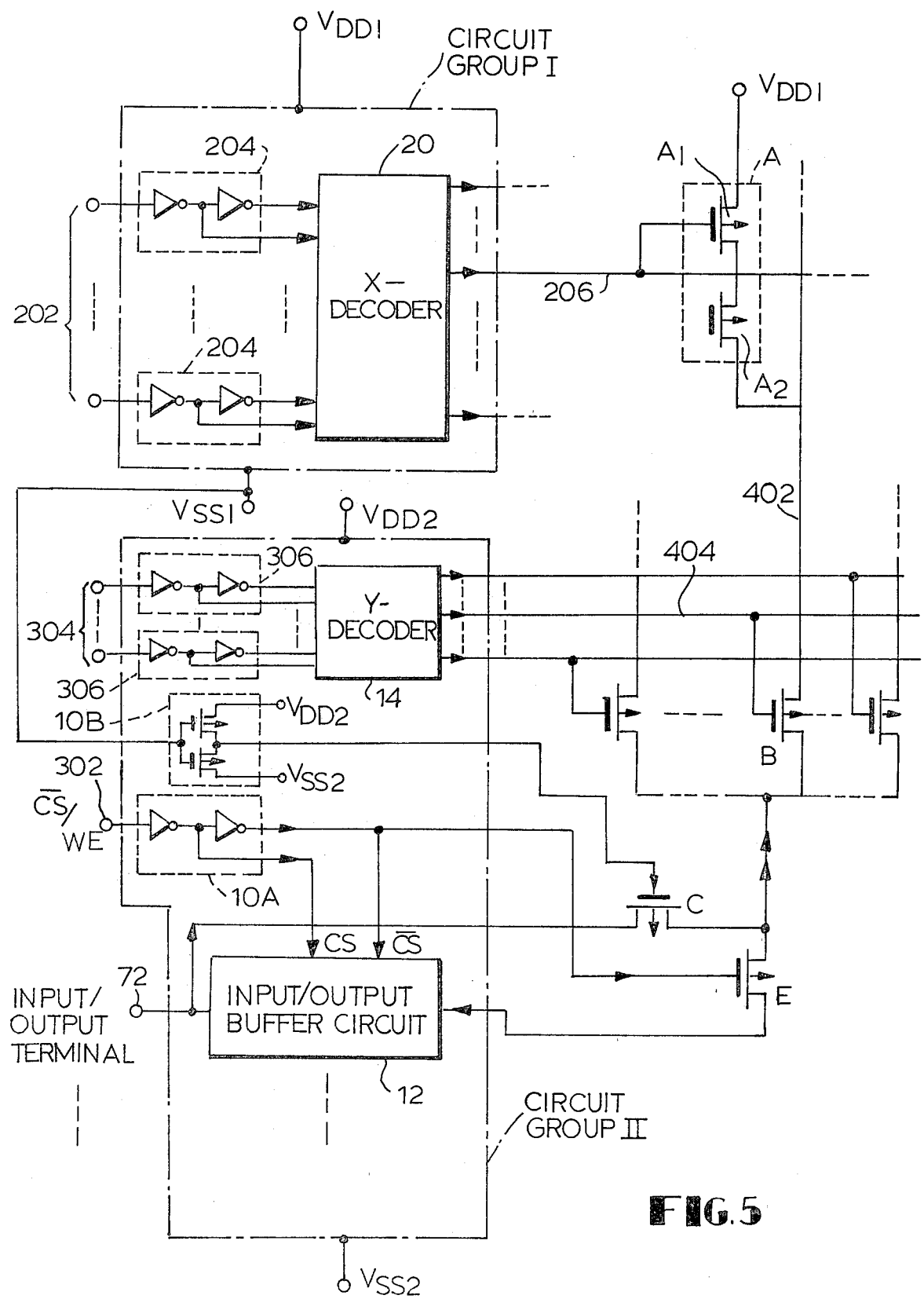
FIG. 5 is a detailed circuit diagram of the arrangement shown in FIG. 4.
Figure 6A:
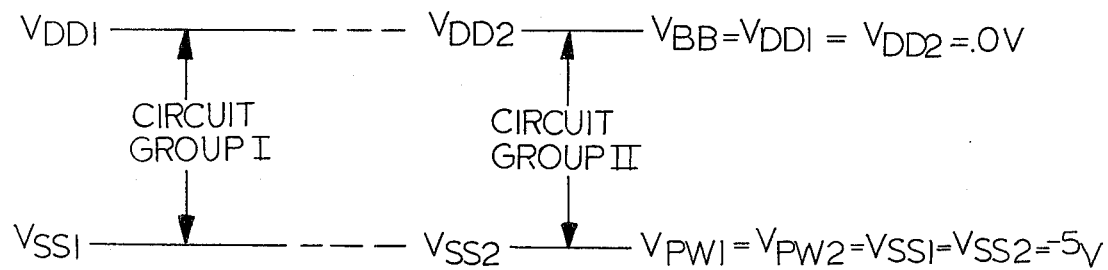
FIGS. 6a and 6b are schematic diagrams of electric source systems useful in explaining the operation of the read and write mode of the arrangement shown in FIG. 5.
Figure 6B:
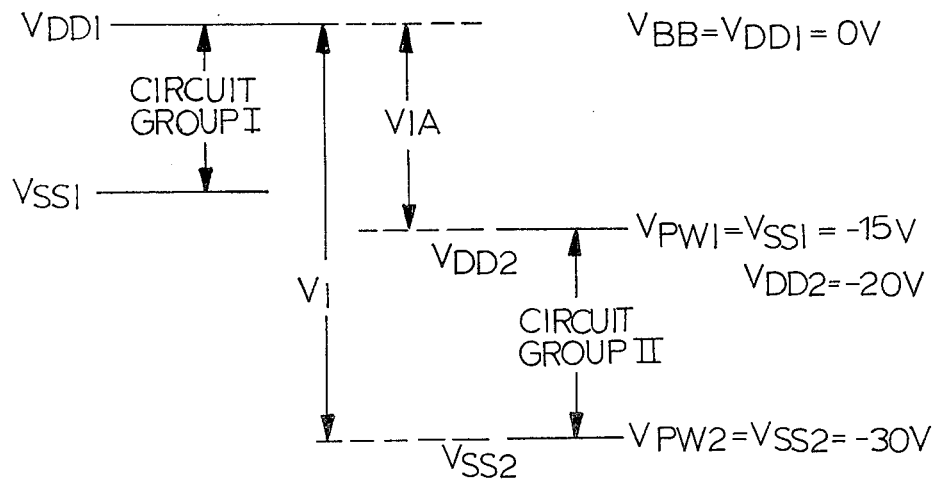

FIG. 5 is a circuit diagram showing the details of the arrangement shown in FIG. 4 and shows an EPROM as one embodiment of the present invention. The arrangement illustrated comprises a circuit group I operating with source potentials $V_{DD1}$ and $V_{SS1}$, a circuit group II operating with source potentials $V_{DD2}$ and $V_{SS2}$, and associated circuits. In this case, each of the circuit groups I and II is formed of a conventional CMOS circuit, as will be described hereinafter, and produces an output of $V_{DD1}$ or $V_{DD2}$ at its "H" level and an output of $V_{SS1}$ or $V_{SS2}$ at its "L" level, respectively. Also those source potentials fulfill the relationship as shown in FIG. 6a in the read mode of operation and that shown in FIG. 6b in the write mode of operation. Thus the potential relationship is different between the read and write modes of operation. In FIGS. 6a and 6b the direction out of the plane of each FIGS. 6a and 6b is a direction of negative potential while the opposite direction is a direction of positive potential. Also FIGS. 6a and 6b denote, on the right, typical magnitudes of the voltages $V_{DD1}$, $V_{DD2}$ and $V_{SS2}$ and the potential $V_{BB}$ of a substrate.

The operation of the arrangement shown in FIG. 5 will be briefly described with reference to FIGS. 6a and 6b.

In the read mode of operation $V_{BB} = V_{DD1} = V_{DD2}$ and $V_{SS1}(=V_{PW1}) = V_{SS2}(=V_{PW2})$, as shown in the FIG. 6a where $V_{BB}$ designates the potential of the substrate (see the reference numeral 30 in FIG. 8) as described above, $V_{PW1}$ the potential of a p well disposed in the circuit group I and $V_{PW2}$ designates the potential of a p well disposed in the circuit group II. Under these circumstances, an X decoder 20, a Y decoder 14, a chip selection and writing enabling circuit 10A and a writing enabling circuit 10B operate to turn transistors $A_1$, B and E on and turn the transistor C off so as to form a current path $V_{DD1}-A_1-A_2-B-E-D-V_{SS2}$ in the arrangement of FIG. 5 for the memory cell A desired to be read out. The reference characters $A_1$, $A_2$, B and E designating the current path denote transistors included therein, but the character D denotes a transistor included in the output buffer circuit 12 as shown in FIG. 4 but not shown in FIG. 5. The floating gate MOS transistor $A_2$ included in the abovementioned current path is conducting when the memory cell A is at the "H" level and is not conducting when the cell is at the "L" level. The conduction of the transistor $A_2$ causes the potential between the transistors E and D to be higher than $V_{SS2}$ while the nonconduction thereof causes it to be equal to $V_{SS2}$. In this case, it is noted that the transistor D is always in its ON state.

Then this potential is shaped by the output buffer circuit 12 which may be composed of several stages of conventional interconnected CMOS inverters. When the memory is at the "H" level the potential $V_{DD2}$ is delivered to the input/output terminal 72 of the output buffer circuit 12, and when the memory is at the "L" level, the potential $V_{SS2}$ is delivered to that terminal. At that time, the read out operation has been completed.

Figure 7:
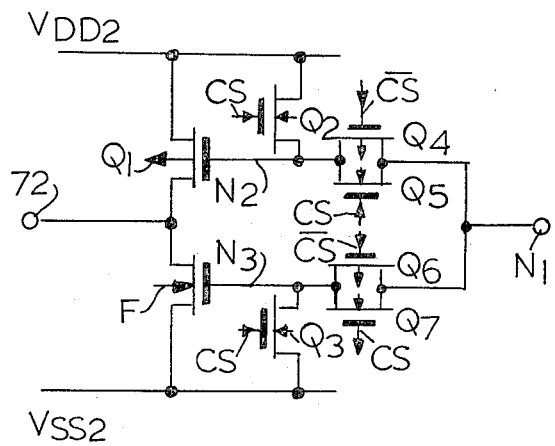
FIG. 7 is a detailed circuit diagram of the output stage of the output buffer circuit shown in FIG. 5.

The output stage of the output buffer circuit 12 can have a circuit configuration as shown in FIG. 7. Assuming that, in FIG. 7, the preceding output node $N_1$ of the output buffer circuit 12 is directly connected to nodes $N_2$ and $N_3$ by omitting MOS transistors $Q_2$ through $Q_7$, the output stage thereof is formed of a conventional CMOS inverter including a pair of MOS transistors $Q_1$ and F. Under the assumed conditions the two leads $\overline{CS}$ and CS connected to the output buffer circuit 12 as shown in FIG. 4 are connected to gates of the transistors $Q_2$ $Q_5$ and $Q_7$ and the gates of the transistors $Q_3$, $Q_4$ and $Q_6$ respectively. Then when the terminal 302 of the chip selection and writing enabling circuit 10A is put at the "L" level or at the potential $V_{SS2}$, the nodes $N_1$, $N_2$ and $N_3$ are electrically connected together to deliver stored data to the terminal 72 as described above. However, when the terminal 302 is put at the "H" level, the node $N_1$ is electrically isolated from the nodes $N_2$ and $N_3$ to put the nodes $N_2$ and $N_3$ at the potential $V_{SS2}$ and $V_{DD2}$ respectively. This results in the simultaneous turn-off of the MOS transistors $Q_1$ and F. Therefore the stored data as described above is not only prevented from being delivered to the terminal 72 but also the latter is brought into an electrically floating state. This electrically floating state is utilized in the write mode of operation as will be described later, provided that a plurality of EPROM's are used in a parallel circuit relationship in the read mode of operation.

Since the writing enabling circuit 10B shown in FIG. 5 is in the potential relationship as illustrated in FIGS. 6a and 6b, it operates as follows:

In the read mode of operation the writing enabling circuit 10B has an input $V_{SS1}$ at the "L" level applied thereto and provides an output at the "H" level or $V_{DD2}$ to turn the MOS transistor C off. In the writing mode of operation, however, the potential $V_{SS1}$ puts the circuit 10B at its "H" level and therefore the output therefrom is at the "L" level or at the potential $V_{SS2}$. This results in the turn-on of the MOS transistor C.

In order to turn the transistor $A_1$ on as described above, the X decoder 20 delivers the "L" level potential or the potential $V_{SS1}$ to only that row 206 connected to the transistor $A_1$ to turn it on while at the same time it delivers an "H" level potential or the potential $V_{DD2}$ to all of the remaining rows. Also in order to cause transistor B connected to the transistor $A_1$ to be turned on at this time, the Y decoder 14 delivers the "L" level potential $V_{SS2}$ to only that column line 404 in which the transistor B is connected and all the remaining column lines are kept at their "H" level potential $V_{DD2}$. It is to be noted that in the write mode of operation the X and Y decoders 20 and 14 respectively, change the source potentials as shown in FIG. 6b and can be utilized as they are.

In FIG. 5 the X decoder 20 is shown as being connected to a plurality of input terminals 202 for receiving X address signals through parallel X buffer circuits 204, one for each input terminal 202, and the Y decoder is shown as being similarly connected to a plurality of input terminals 304 for receiving Y address signals through parallel Y buffer circuits 306, one for each input terminal 304. The X address buffer circuits 204 and the X decoder 20 forming the circuit group I correspond to the X address circuit 20, as shown in FIGS. 3 and 4, and the Y address buffer circuits 306 and the Y decoder 14 forming part of the circuit group II correspond to the $Y_1$ address circuit 14, as shown in FIGS. 3 and 4. The chip selection and writing enabling circuit 10A and the writing enabling circuit 10B shown in FIG. 5 correspond to the chip selection buffer circuit 10 as illustrated in FIG. 1.

In order to operate the arrangement of FIG. 5 in the write mode, the X decoder 20, Y decoder 14, the chip selection and writing enabling circuit 10A and the writing enabling circuit 10B control the transistors $A_1$, B, C and E so as to form a current path.

$V_{DD1}-A_1-A_2-B-C-$Input/output terminal 72 as in the read mode of operation, but the source potentials have the potential relationship as shown in FIG. 6b.

Under these circumstances signals developed in the circuit group I and including an input and an output signal are expressed by $V_{DD1}$ at the "H" level and $V_{SS1}$ at the "L" level. Similarly all signals developed in the circuit group II are expressed by $V_{DD2}$ at the "H" level and by $V_{SS2}$ at the "L" level. Therefore the two circuit groups I and II are independently operated on a common chip and perform substantially the same operation as conventional CMOS circuits with respective electric sources having appropriate potentials.

It is noted that the circuit group I is supplied with the source potentials in a conventional manner because the substrate and the p well have respective potentials of $V_{DD1}$ and $V_{SS1}$. As a result, it is natural that operation in the same way as CMOS circuits can be expected. In the circuit group II however, the p well has the potential $V_{SS2}$ but the substrate has a potential unequal to $V_{DD2}$. Therefore the manner in which the source potentials are applied to the circuit group II cannot be said to be conventional. This results in the necessity of describing how the circuit group II performs the same operation as conventional circuits. This description will be given later.

Returning to the description of the operation in the write mode, the potential $V_{SS2}$ from the input/output terminal 72 is applied to the memory cell $A_1$, $A_2$ through the current path formed in the write mode to place the memory cell A at the "H" level. On the other hand, when it is desired to place the memory cell $A_1$, $A_2$ at the "L" level, the potential $V_{DD2}$ from the terminal 72 is similarly applied to the memory cell. This results in the application of a voltage $V_1 = V_{DD1} - V_{SS2}$ or $V_{1A} = V_{DD1} - V_{DD2}$ across both ends of the floating gate MOS transistor $A_2$ for placing the memory cell at either the "H" or "L" level respectively. By selecting the voltage $V_1$ so that it is greater than a voltage at which electrons start to be injected into the floating gate of the transistor $A_2$ or by selecting the voltage $V_{1A}$ to be smaller than the injection initiating voltage, the desired writing operation can be selectively performed. That is, for a voltage $V_1$ greater than the injection initiating voltage, the electrons are injected into the floating gate of the transistor $A_2$ to place it at the "H" level. On the other hand, for a voltage $V_{1A}$ smaller than the initiating voltage, no electrons are injected into the floating gate so that it is at the "L" level.

Considering the conduction of the current path formed in the write mode of operation starting with the input/output terminal 72, the chip selection and writing enabling terminal 302 (see FIG. 5) is put at the "H" level as described above in conjunction the read mode of operation of the output end of the output buffer circuit, as shown in FIG. 7. Therefore, the relationship between the "H" and "L" levels in the arrangement of FIG. 7 is such that the transistors $Q_1$ and F are turned off to electrically disconnect the output buffer circuit 12. This is true in the case when selection of the chip is not effected in the read mode of operation.

Then the transistor C is put in its ON state for the following reason:

The potential $V_{SS1}$ applied to the input to the writing enabling circuit 10B (FIG. 5) is now at the "H" level as shown in FIG. 6b, which is different from the level of $V_{SS1}$ in the read mode of operation described above. This results in the circuit 10B delivering an output at the "L" level.

Since the chip selection and writing enabling circuit 10A applies the "H" level potential $V_{DD2}$ to the gate of the transistor E, the latter is turned off.

Further the transistor B is turned on because the gate thereof is supplied with an "L" level potential $V_{SS2}$ from the Y decoder 14.

Finally, the transistor $A_1$ is turned on. This is because the X decoder 20 supplies an "L" level potential $V_{SS1}$ to the gate thereof.

Also the write mode of operation is different from the read mode in that in the write mode the Y decoder 14 applies an "H" level potential to the gates of the transistors B in the columns other than the column with the transistor B selected to be conducting. Because this "H" level is set by the potential $V_{DD2}$, those transistors are in their ON state when their source potentials are no higher than the potential $V_{DD2}$. This means that the potential $V_{DD2}$ is applied to lines for unselected columns which lines are connected to the Y decoder 14 through the associated transistors. However, as described above, the writing operation is not performed at a voltage $V_{1A}$ fulfilling the conditions $V_{1A}=V_{DD1}-V_{DD2}$ (see FIG. 6b). Accordingly, erroneous writing does not take place.

Figure 8:
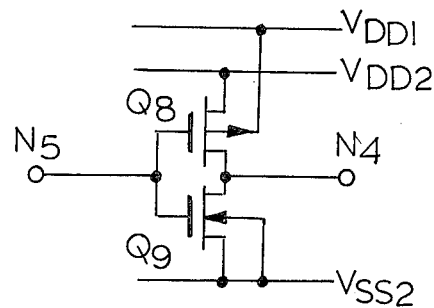
FIG. 8 is a circuit diagram of a CMOS circuit useful in explaining the operation in the write mode of the circuit group II shown in FIG. 5.

The operation of the circuit group II will now be described in more detail. It is recalled that the circuit group II performs substantially the same operation as conventional CMOS circuits with source potentials as shown in FIG. 6b. FIG. 8 shows an inverter as one typical example of conventional CMOS circuits. When the arrangement illustrated is supplied with the source potentials shown in FIG. 6b, only the p channel MOS transistor $Q_8$ used is different from conventional CMOS circuits. More specifically, the transistor $Q_8$ has a source potential $V_{DD2}$, and a drain potential equal in potential to a node $N_4$, but the substrate is put at the potential $V_{DD1}$ higher than the source potential $V_{DD2}$ and a reverse voltage is applied across the source of the transistor $Q_8$ and the substrate. At that time, the threshold voltage of transistor $Q_8$ is changed in the negative direction due to the application of the reverse voltage, because it is of a p channel type. The term "threshold voltage" means a gate potential at which the transistor is caused to become conductive with respect to the source potential. In practical integrated circuits, the threshold voltage is, for example 1.2 volts for a reverse voltage having a zero magnitude. Also for $V_{DD2}=-20$ volts and $V_{BB}=V_{DD1}=0$ volts, as shown in FIG. 6b, the threshold voltage is on the order of $-3$ volts.

When the arrangement of FIG. 8 has a node $N_5$ supplied with the "L" level potential $V_{SS2}=-30$ volts, the p channel MOS transistor $Q_8$ is turned on while an n channel MOS transistor $Q_9$ is turned off. Therefore the node $N_4$ has a potential $V_{DD2}$. Alternatively, the application of the "H" level potential $V_{DD2}=-20$ volts to the node $N_5$ causes the p channel MOS transistor $Q_8$ to be turned off and the n channel MOS transistor $Q_9$ to be turned on. In this circumstances the node $N_4$ has the potential $V_{SS2}$.

In this way, the arrangement of FIG. 8 can deliver to the next succeeding stage a signal having an amplitude corresponding to the whole source potential so that it can be said that the circuit group II operated in the write mode is substantially identical in operation to conventional CMOS circuits. It is noted that the operation just described is generally performed by integrated circuits including p and/or n channel MOS transistors.

As described above, the present invention makes it possible to write data in memory devices requiring a high voltage such as EPROM's by dividing the device into circuit groups I and II and placing them in the potential relationship as shown in FIG. 6b. Under these circumstances, n channel MOS transistors included in the circuit group I are operated in the same manner as in conventional CMOS circuits. Accordingly as long as the typical potential relationship as shown in FIG. 6b is maintained, such transistors can be used without any problems. This is because the applied potentials are less than the breakdown voltage for the pn junction of the n channel MOS transistors.

Figure 9:
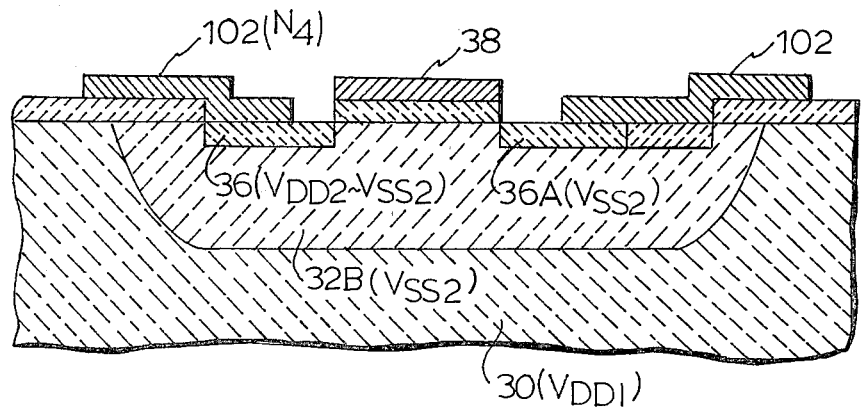
FIG. 9 is a fragmental longitudinal sectional view of an n channel MOS transistor disposed in the circuit group II shown in FIG. 5.

However, the circuit groups II is required to be constructed so that the pn junctions of the n channel MOS transistors therein are prevented from breaking down. FIG. 9 shows a preferred construction of an n channel MOS transistor for use in the circuit group II. In the arrangement illustrated, the n channel MOS transistor includes a source region formed of a p well 32B, a p+ diffusion region 34 for providing an ohmic contact, and an n+ diffusion region 36A, with the regions 34 and 36A connected to a metallic electrode 102. The transistor further has a drain region formed of an n+ diffusion region 36 connected to a metallic electrode 102 which may be, in turn, connected to the p channel MOS transistor in the arrangement of FIG. 8 and correspond to the node $N_4$ shown in FIG. 8. The source region is put at the potential $V_{SS2}$ such as shown in FIG. 6b and also shown in FIG. 9 and the drain region has a potential variable between the potential $V_{DD2}$ and $V_{SS2}$ as shown in FIG. 9.

As shown in FIG. 9, three pn junctions are formed between the p well 32B and the diffusion region 36A, one between the p well and the drain region 36, and one between the p well and the substrate 30. The first one of those pn junctions does not have a voltage applied thereto and the second one has a voltage having a maximum magnitude of ($V_{DD2} - V_{SS2}$) applied thereto. This maximum magnitude voltage may be 10 volts in the example shown in FIG. 6b. However, such a voltage is less than the breakdown voltage of the n channel MOS transistor and therefore breakdown is not caused. However, the remaining junction is at issue because it has a high voltage of ($V_{DD1} - V_{SS2}$—' typically 30 volts applied thereto. This junction, however, is not broken down for the following reasons:

A pn junction is broken down because the electric field established in the vicinity of the pn junction is in excess of a predetermined limit. The less the impurity concentration on one side of the pn junction and also the greater the radius of curvature of each end portion of the junction, the higher the voltage which can be applied to the junction until the abovementioned limit is reached. These conditions are easily fulfilled by the substrate and the p well in the transistor of FIG. 9.

In order to make the pair of writing and reading selection MOS transistors C and E respectively approximate a complementary MOS inverter as much as possible, the MOS transistor C may be an n channel type while the MOS transistor E may be a p channel type as shown in FIG. 10.

The improvements as above described in conjunction with FIG. 4 are important in order to decrease in the voltage $V_{DD}$ across the electric source 26, but it is difficult to expect improvements such as a large decrease in current consumption or a great reduction in the breakdown of components because the peripheral circuits connected to the gate electrodes of the MOS transistors are operated with the same voltage. By considering the concept of the improvements as above described, it will be understood that the gate electrodes can have voltages fulfilling the relationship $V_G - V_{TH} > V$ applied thereto. Accordingly, when writing data, the voltage applied across the series of the transistors A, B, C. D and E can be separated from the voltages applied to the peripheral circuits of those transistors without any drawback.

In order to make it possible for the voltages applied to the MOS transistors to fulfill the relationship $V_G - V_{TH} > V_D$, the n channel MOS transistors can have applied thereto a voltage higher than $V_S + V_{TH}$, where $V_S$ designates the source voltage of the MOS transistor, while the p channel MOS transistors have applied thereto a voltage less than $V_D - V_{TH}$.

Figure 11:
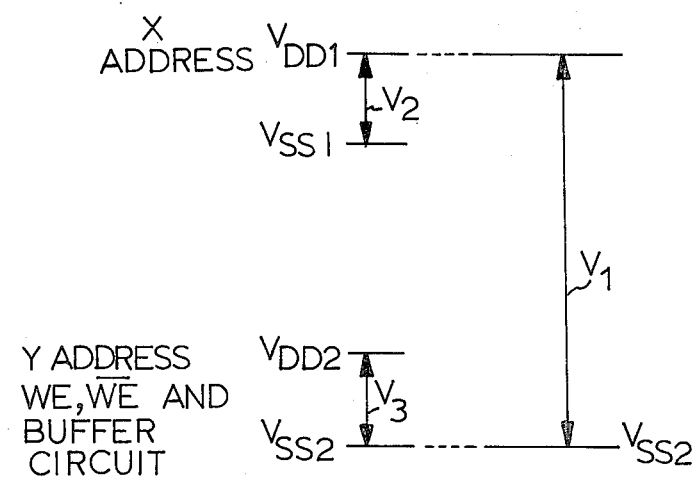
FIG. 11 is a diagram of the electric source system used in the present invention.

FIG. 11 shows schematically an electric source system that can be connected to the arrangement of FIG. 3. As shown in FIG. 11, the series circuit formed of the transistors A, B, C, D and E (see FIG. 3) is operated with the highest potential difference $V_1$ between the potential $V_{DD1}$ of one DC source and the potential $V_{SS2}$ of another DC source. The X address circuit 20 can be operated with the relatively low potential difference between the potential $V_{DD1}$ and the potential $V_{SS1}$ of a separate DC source while the Y address circuit 14' the readout and writing selection circuits, designated by WE and $\overline{WE}$ respectively in FIG. 11 and the output buffer circuit 12 can be operated with a relatively low potential difference $V_3$ between the potential $V_{DD2}$ of another DC source and the potential $V_{SS2}$. Under these circumstances, the relationship $V_G - V_{TH} > V_D$ is fulfilled so that the voltage drops across the transistors B, C and D are determined by the ratios of mutual conductance among them. With the potential difference $V_1$ equal to $V_2$, the ratios of mutual conductances remain unchanged from those of the corresponding circuit shown in FIG. 3. On the other hand, with the potential difference $V_1$ unequal to $V_2$, the MOS transistors can be given different channel lengths and widths to improve the associated ratios of mutual conductance.

When the electric source system has been divided into a plurality of subsystems, in this case three subsystems, a high voltage is applied only across the transistors A, B, C and D. Accordingly, the current consumption is decreased and the breakdown phenomena is reduced.

Figure 12:
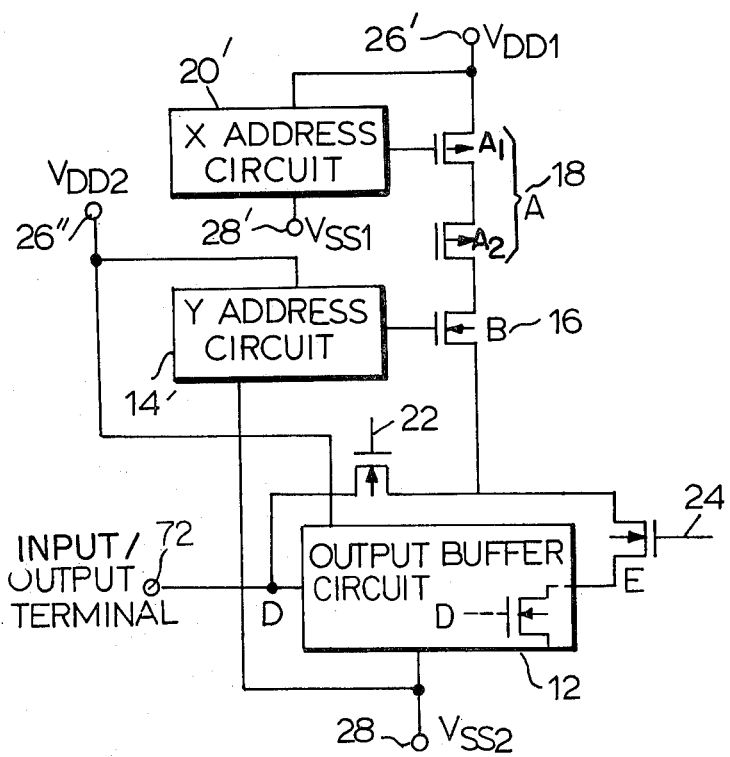
FIG. 12 is a diagram the same as FIG. 3 and having added thereto the electric source system shown in FIG. 11.

When an electric source system for the arrangement of FIG. 3 is divided into three subsystems as described above in conjunction with FIG. 11, the arrangement shown in FIG. 12 results. In FIG. 12, a DC source 26' at the potential $V_{DD1}$ is connected to the drain electrode of both the upper MOS transistor A and the X address circuit 20'. The X address circuit 20' is also connected to another DC source 28' at the potential $V_{SS1}$. Another DC source 26" is connected to both the Y address circuit 14' and the output buffer circuit 12 while the latter two circuits 14' and 12 are connected to a separate DC source 28 at the potential $V_{SS2}$.

It will be readily understood that the electric source system connected to the arrangement shown in each of FIGS. 4 and 5 can be divided in a manner similar to that described above in conjunction with FIG. 11.

Since semiconductor memory circuits such as shown in FIG. 12 include n channel MOS transistors and p channel MOS transistors formed on a single semiconductor substrate and the multi-potential electric source system connected thereto, a complementary MOS circuit can be advantageously used. In that case, the use of a silcon-on-sapphire structure (which is abbreviated as "SOS") is advantageous in view of the adoption of the multipotential electric source system because the MOS transistors are electrically isolated from one another by the electrical insulation present. However, it is to be understood that such transistors may also be formed on a silicon substrate in the manner as shown in FIG. 13.

Figure 13:
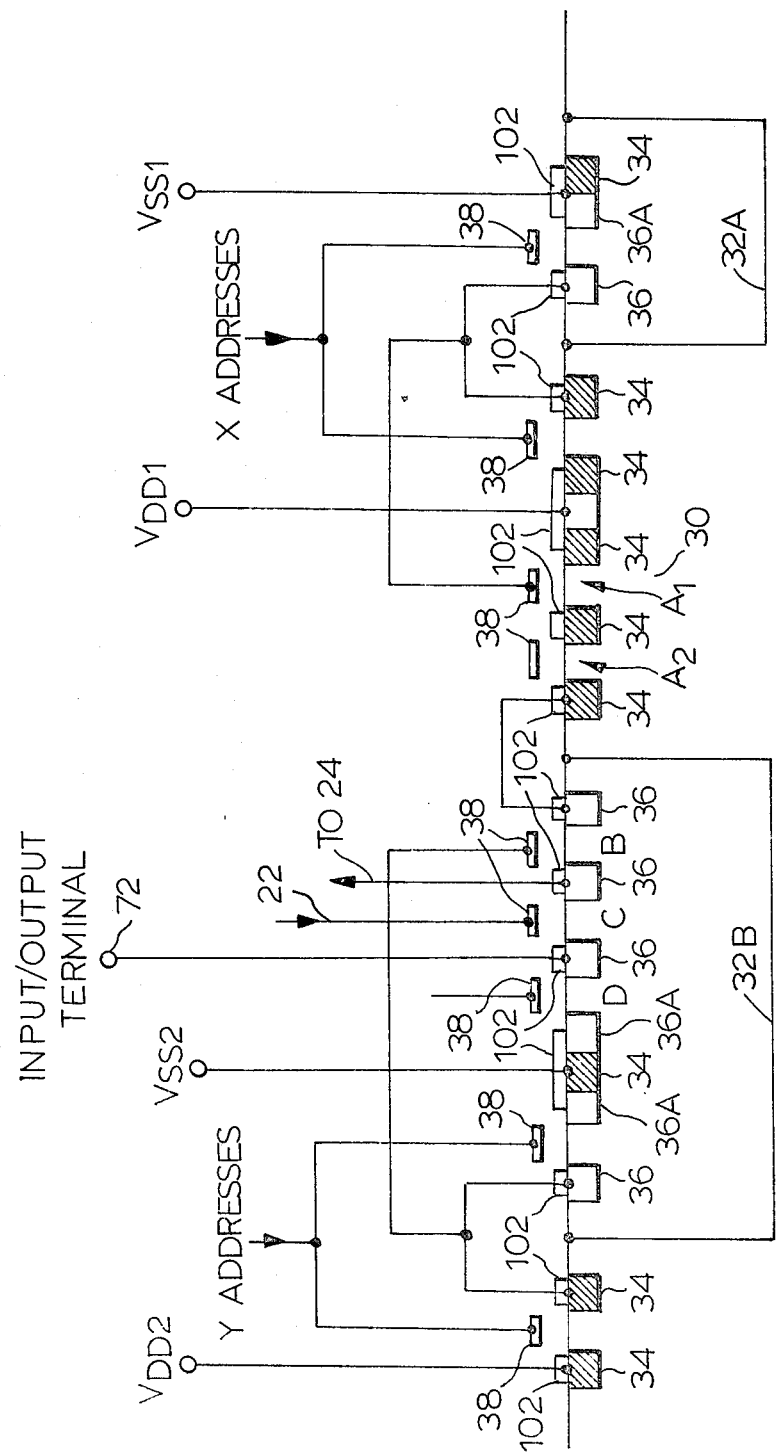
FIG. 13 is a schematic cross sectional view of an integrated circuit structure into which the arrangement shown in FIG. 12 is formed.

In FIG. 13, a semiconductor substrate 30 includes a plurality of p and n type wells 32 disposed in a predetermined pattern on one of the main faces thereof, although only two wells are shown for purposes of illustration. Then a plurality of p+ type diffusion regions 34 and n+ type diffusion regions 36 are disposed in a predetermined pattern on the main face of the substrate 30 including the wells 32 by a selective diffusion technique and gate electrodes 38 are disposed in ohmic contact with those portions of the substrate face between pairs of predetermined adjacent diffusion regions in a well known manner to form MOS transistors A, B, C and D. The hatched areas designate p+ type diffusion regions and the blank areas designate n+ type regions.

As shown in FIG. 3, the MOS transistor A$_2$ with the floating gate electrode is externally connected to the MOS transistor B to form a series combination of the transistors A$_1$, A$_2$, B, C and D. Also the X and Y address signals are applied to the gate electrodes of the MOS transistors A$_1$ and B respectively and to associated diffusion regions. The n+ diffusion region common to the transistors B and C is connected to the readout selection circuit 24, not shown in FIG. 13. The potentials $V_{DD1}$, $V_{DD2}$, $V_{SS1}$ and $V_{SS2}$ are applied to the diffusion regions in the manner shown in FIG. 13 to divide the electric source system into three subsystems as described above in conjunction with FIGS. 11 and 12.

From the foregoing it is seen that the present invention provides a semiconductor memory integrated circuit including a signal path from each memory cell of a memory matrix leading to the output terminal of an output buffer circuit and formed of a plurality of MOS transistors having different conductivity types. In addition, the electric source system is divided into a plurality of subsystems connected to different peripheral circuits which in turn are connected to gate electrodes of the transistors. Therefore, each of the MOS transistors can be operated in the triode region resulting in advantages such as low power consumption, high speed operation and writing at a low voltage.

While the present invention has been illustrated and described in conjunction with a few preferred embodiments thereof, it is to be understood that numerous changes and modifications may be resorted to without departing from the spirit and scope of the present invention. For example, while the present invention has been illustrated in conjunction with a memory cell formed of p channel MOS transistors it is understood that the memory cell may be formed of n channel MOS transistors with the associated MOS transistors having a channel conductivity type opposite that illustrated.

What is claimed is:

1. A semiconductor memory device comprising: a memory cell including a memory element formed of a MOS transistor for performing a storing operation by accumulating an electric charge on an electrically insulating film; a gate circuit including a MOS transistor serially connected to said memory cell; a readout selection circuit including a MOS transistor serially connected to said MOS transistor included in said gate circuit; an output buffer circuit including a MOS transistor connected to said MOS transistor included in said readout selection circuit; a writing selection circuit including a MOS transistor connected in a parallel circuit relationship with said MOS transistors included in said readout selection circuit and said output buffer circuit; and a voltage source system connected to said memory cell, said gate circuit, said writing selection circuit, said readout selection circuit and said output buffer circuit for applying voltages to each of said MOS transistors to satify the relationship $V_G - V_{TH} > V_D$ for each of said MOS transistors, wherein $V_G$ designates the gate voltage, $V_{TH}$ designates the threshold voltage and $V_D$ designates the drain voltage; the conductivity type of said MOS transistors included in said gate circuit being different from the conductivity type of said MOS transistor forming said memory element.

2. A semiconductor memory device comprising: a memory cell including a memory element formed of a MOS transistor for performing a storing operation by accumulating an electric charge on an electrically insulating film; a gate circuit including a MOS transistor serially connected to said memory cell; a readout selection circuit including a MOS transistor serially connected to said MOS transistor included in said gate circuit; an output buffer circuit including a MOS transistor connected to said MOS transistor included in said readout selection circuit; a writing selection circuit including a MOS transistor connected in a parallel circuit relationship with said MOS transistors included in said readout selection circuit and said output buffer circuit; and a voltage source system connected to said memory cell, said gate circuit, said writing selection circuit, said readout selection circuit and said output buffer circuit for applying voltages to each of said MOS transistors to satisfy the relationship $V_G - V_{TH} > V_D$ for each of said MOS transistors, wherein $V_G$ designates the gate voltage, $V_{TH}$ designates the threshold voltage and $V_D$ designates the drain voltage; the conductivity type of said MOS transistors included in said writing selection circuit being different from the conductivity type of said MOS transistor forming said memory element.

3. A semiconductor memory device comprising: a memory cell including a memory element formed of a MOS transistor for performing a storing operation by accumulating an electric charge on an electrically insulating film; a gate circuit including a MOS transistor serially connected to said memory cell; a readout selection circuit including a MOS transistor serially connected to said MOS transistor included in said gate circuit; an output buffer circuit including a MOS transistor connected to said MOS transistor included in said readout selection circuit; a writing selection circuit including a MOS transistor connected in a parallel circuit relationship with said MOS transistors included in said readout selection circuit and said output buffer circuit; and a voltage source system connected to said memory cell, said gate circuit, said writing selection circuit, said readout selection circuit and said output buffer circuit for applying voltages to each of said MOS transistors to satisfy the relationship $V_G - V_{TH} > V_D$ for each of said MOS transistors, wherein $V_G$ designates the gate voltage, $V_{TH}$ designates the threshold voltage and $V_D$ designates the drain voltage; the conductivity type of said MOS transistors included in said readout selection circuit being different from the conductivity type of said MOS transistor forming said memory element.

4. A semiconductor memory device comprising: a memory cell including a memory element formed of a MOS transistor for performing a storing operation by accumulating an electric charge on an electrically insulating film; a gate circuit including a MOS transistor serially connected to said memory cell; a readout selection circuit including a MOS transistor serially connected to said MOS transistor included in said gate circuit; an output buffer circuit including a MOS transistor connected to said MOS transistor included in said readout selection circuit; a writing selection circuit including a MOS transistor connected in a parallel circuit relationship with said MOS transistors included in said readout selection circuit and said output buffer circuit; and a voltage source system connected to said memory cell, said gate circuit, said writing selection circuit, said readout selection circuit and said output buffer circuit for applying voltages to each of said MOS transistors to satisfy the relationship $V_G - V_{TH} > V_D$ for each of said MOS transistors, wherein $V_G$ designates the gate voltage, $V_{TH}$ designates the threshold voltage and $V_D$ designates the drain voltage; the conductivity type of said MOS transistors included in said output buffer circuit being different from the conductivity type of said MOS transistor forming said memory element.

5. A semiconductor memory device as claimed in claims 1 or 2 or 3 or 4, wherein said writing selection circuit and said readout selection circuit are formed of complementary MOS transistors.

6. A semiconductor memory device as claimed in claims 1 or 2 or 3 or 4, wherein said memory element is formed of a p channel MOS transistor.

* * * * *